United States Patent [19]

Schreck

[11] Patent Number: 4,858,187

[45] Date of Patent: Aug. 15, 1989

[54] PROGRAMMING IMPLEMENTATION CIRCUIT

[75] Inventor: John F. Schreck, Houston, Tex.

[73] Assignee: Texas Instruments Incorporated, Dallas, Tex.

[21] Appl. No.: 150,861

[22] Filed: Feb. 1, 1988

[51] Int. Cl.⁴ .......................................... G11C 11/34
[52] U.S. Cl. .............................. 365/185; 365/189.09
[58] Field of Search ............... 365/104, 182, 185, 189; 357/23.5

[56] References Cited

U.S. PATENT DOCUMENTS 4,761,764  8/1988  Watanabe ...................... 365/185 X Primary Examiner—Joseph A. Popek
Attorney, Agent, or Firm—Theodore D. Lindgren

[57] ABSTRACT

A programming implementation circuit for use in programming a floating-gate, avalanche-injection, metal-oxide-semiconductor integrated-circuit memory cell. The circuit is comprised of programming control means, a decoder switching means and an enabling means. A current-limiting input voltage is transmitted by the decoder switching means to the programming control means when the circuit is placed in one state by the enabling means, causing the control means to limit current during programming. When the cicuit is placed in a second state by the enabling means, the programming control means is deactivated and the bit line of the memory circuit is connected to a sense amplifier.

8 Claims, 1 Drawing Sheet

PROGRAMMING IMPLEMENTATION CIRCUIT

BACKGROUND OF THE INVENTION

This invention relates to a circuit for implementing programming of an array of floating-gate, avalanche-injection, metal-oxide-semiconductor (FAMOS) transistors formed on an integrated circuit chip.

A circuit for controlling and optimizing the source-drain current flow during programming of an array of floating-gate memory cells is described application Ser. No. 786,981, now U.S. Pat. No. 4,723,225, issued on Feb. 2, 1988 to Jeffrey K. Kaszubinski, et al, and assigned to Texas Instruments Incorporated. The circuit disclosed and claimed in the foregoing patent provides an optimized voltage level to be applied during programming to the gates of control transistors in series with bit lines. The control transistors in turn allow optimum levels of current to flow through the bit lines and the source-drain paths of the FAMOS transistors during programming.

Output signals from decoder circuits are used during normal operation of memory cells to facilitate connection of bit lines of memory cells to sense amplifiers for the purpose of reading voltage status. Ideally, the same decoder circuit signal output could also be used to activate the output of the current-limiting circuit referenced above during programming. However, the output of the decoder circuits must generally be altered in some manner to facilitate programming and to facilitate reading because different voltage levels are required and/or because different types of transistors are used for electrical access to the bit lines of memory cell arrays.

Accordingly, there is a need for a relatively simple programming implementation circuit in which one output of a decoder circuit may be adapted for use in programming memory cells and also for use in reading the status of memory cells.

SUMMARY OF THE INVENTION

This invention provides a relatively simple programming implementation circuit that permits a current-limiting voltage level to be applied to the gates of control transistors during programming using the output from a decoder circuit. The current-limiting circuit also permits the same decoder circuit output, with different control inputs, to be used for reading the status of the programmed cells.

The invented circuit is comprised of a programming control means, a decoder switching means and an enabling means. The enabling means activates the programming control means to permit current flow from a voltage source to a memory cell bitline. The current is limited in accordance with a current-limiting input voltage. The current limiting input voltage is transmitted by the decoder switching means to the programming control means in response to a signal from a decoder circuit. The enabling means deactivates the programming control means during read operation of the memory circuit and connects the bit line to the input of a sense amplifier. The bit line status is transmitted by the decoder switching means to a sense amplifier in response to the decoder signal.

BRIEF DESCRIPTION OF THE DRAWINGS

The novel features of this invention are set forth in the appended claims. The invention, its features, and its advantages are described below in conjunction with the following drawings:

DESCRIPTION OF THE EMBODIMENT

Figure 1:
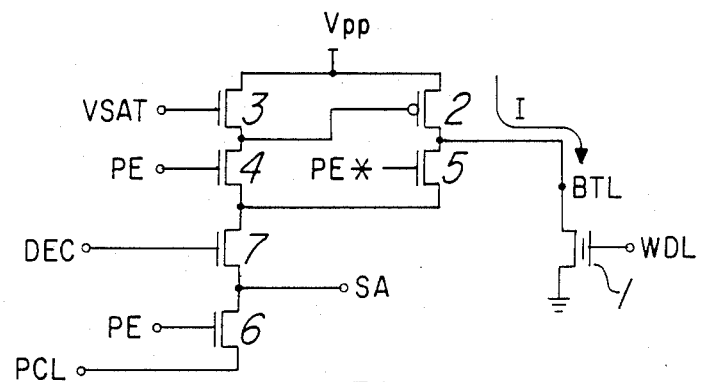
FIG. 1 is a circuit diagram of the programming implementation device of this invention.

Referring to FIG. 1, memory cell 1 is comprised of a FAMOS transistor and represents one of many such cells arrayed in integrated circuit form. Memory cell 1 typically contains other transistors for grounding and enabling or disenabling the floating gate transistor. The programming gate of the FAMOS transistor of memory cell 1 is connected to one of a number of wordlines WDL and its drain is connected to one of a number of bitlines BTL. The programming control means is comprised in part of P-channel programming control transistor described in U.S. Pat. No. 4,723,225 referred to above. That patent describes and claims a circuit for deriving a control voltage that is connected to the PCL terminal of FIG. 1 and that, when applied to the gate of programming control transistor 2, limits the charging current I in the bitline BTL to an optimum value. Transistors 3, 4, 5 and 6 comprise an enabling means that connects and disconnects programming control transistor 2 to and from bitline BTL. Transistor 7 is a decoder switching means that responds to the output DEC of a decoder circuit, not illustrated. Terminal SA of the circuit is connected to the input of a sense amplifier, not illustrated, that reads the status of bitline BTL during normal operation of the FAMOS device. Terminals PE, PE* and VSAT are connected to the output signals of an enabling circuit. VPP is a direct current programming voltage source, typically 12.5 volts.

The source-drain terminals of transistors 3, 4, 6 and 7 are connected in series between voltage source VPP and input PCL. The source-drain terminals of transistors 2 and 5 are connected in series between voltage source VPP and the common source-drain terminals of transistors 4 and 7. Bitline BTL is connected to the common source-drain terminals of transistors 2 and 5 and the sense amplifier input SA is taken from the common source-drain terminals of transistors 6 and 7. The gate of transistor 2 is connected to the common source-drain terminals of transistors 3 and 4. The gate of transistor 7 is connected to the input terminal DEC.

Transistor 2 is illustrated as a P-channel device. During programming, the gate of transistor 2 is connected to the voltage input, at terminal PCL by transistors 4, 6 and 7. That connection is provided through transistor 7 only upon its activation by an input signal at its gate terminal DEC from the decoder circuit. N-channel transistors 4 and 6 are activated during programming by applying gate voltages at terminals PE of magnitude at least as great as the voltage PCL plus the threshold voltage of transistors 4 and 6. N-channel transistor 5 is deactivated during programming by connecting its gate terminal PE* to ground or zero volts. P-channel transistor 3 is caused to have a relatively large source-drain resistance during programming by connecting its gate terminal VSAT to a voltage that causes transistor 3 to saturate at a relatively low-level current.

Figure 2:
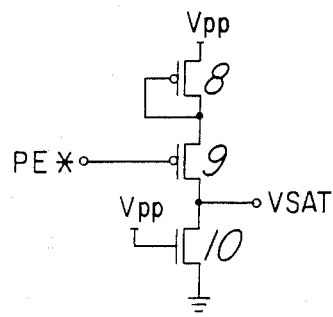
FIG. 2 is a circuit diagram indicating a method for deriving one of the enabling input signals for the circuit of FIG. 1.

A circuit for deriving the VSAT signal is illustrated in FIG. 2. The circuit is comprised of P-channel field-effect transistors 8 and 9 with source/drain terminals connected in series with low-current device 10 between source VPP and ground or reference potential. The gate of transistor 8 is connected to the common source/drain terminal of devices 8 and 9 and the gate of transistor 9 is connected to enabling signal PE*, the complement of enabling signal PE. Low-current device 10 is shown as a N-channel transistor with gate connected to source VPP, but the gate may be connected to another convenient source of voltage or the device may be constructed in another resistor form that yields the desired current value. The desired resistance value of device 10 may be realized through use of one or more well-known fabrication processes.

During read operation of memory device 1 and of its associated integrated circuit, the input SA to a sense amplifier, not illustrated, is connected to bitline BTL by transistors 5 and 7. That connection is provided through transistor 7 only upon its activation by an input at its gate terminal DEC from the decoder circuit. N-channel transistors 4 and 6 are deactivated during read operation by connecting gate terminals PE to ground or zero volts. N-channel transistor 5 is activated during read operation by applying a gate voltage at terminal PE* of magnitude at least as great as the voltage of VPP, which is equal to the value of the operating supply voltage during read operation. P-channel transistor 3 is caused to have a very small source-drain resistance by connecting its gate terminal VSAT to ground or zero volts. The gate of P-channel transistor 2 will, therefore, be at a voltage equal to the voltage of source VPP and transistor 2 will be non-conductive.

During programming operation, the voltage input from the decoder circuit at terminal DEC must vary between zero volts and a voltage at least as great as the voltage PCL plus the threshold voltage of transistor 7. During read operation, the voltage input at terminal DEC generally varies between zero volts and a voltage of perhaps five volts.

Although the circuit disclosed in FIG. 1 uses a significant number of devices, the sizes of devices 3, 4, 5, 6 and 7 are not large and the overall effect of the circuit is to decrease the size of the bar in which the devices are located. One of the advantages of the circuit is that transistor 2 is the only transistor in the drain-side path of the programming current I, thereby reducing the required size of the transistor. Another advantage of the circuit is that one decoder circuit output signal, at different voltage peak levels, is used both for programming and for reading.

While the invention has been described with reference to an illustrative embodiment, the description is not to be construed in limiting sense. Various modifications of the illustrative embodiment of the invention will be apparent to those of skill in the art and it is contemplated that the appended claims will cover any such modifications that fall within the scope of the invention.

What is claimed is:

1. A circuit for applying an optimized programming current to a floating-gate, metal-oxide-semiconductor transistor in response to enabling signals, to a current-limiting signal and to a decoder signal comprising:
    a programming voltage source;
    a programming control means connected to said programming voltage source and to the drain of said floating-gate transistor;
    an enabling means connected to said enabling signals, to said control means, and to said current-limiting signal; and
    a decoder switching means connected to said enabling means;
    wherein during programming operation said programming control means is activated by said decoder switching means and said enabling means to allow a limited current to flow from said voltage source to said drain of said floating-gate transistor, and
    wherein during non-programming operation said programming control means permits negligible current flow from said voltage source to said drain of said floating-gate transistor.

2. The circuit of claim 1 in which said drain of said floating-gate transistor during non-programming operation is connected by said enabling means to a sense amplifier input.

3. The circuit of claim 1 in which said programming control means is a P-channel field-effect transistor with source/drain terminals connected to said voltage source and to said drain of said floating-gate transistor.

4. The circuit of claim 1 in which said decoder switching means is a N-channel field-effect transistor having its gate connected to said decoder signal.

5. The circuit of claim 4 in which said enabling means comprises a P-channel field-effect transistor with source/drain terminals connected to the gate of said programming control means and to said programming voltage source, a N-channel field-effect transistor with source/drain terminals connected to said gate of said programming control means and to a source/drain terminal of said decoder switching means, a N-channel field-effect transistor with source/drain terminals connected to said terminal of said decoder switching means and to said drain of said floating-gate transistor, and a N-channel transistor with source/drain terminals connected to the other source/drain terminal of said decoder switching means and to said current limiting signal.

6. The circuit of claim 5 in which the gate of said enabling P-channel transistor is connected to the common source/drain connection of another enabling P-channel transistor and a grounded low-current device, both of which are in series with the gate and source/drain terminal of yet another P-channel transistor connected to said voltage source.

7. The circuit of claim 6 in which said low current device is a N-channel field-effect transistor with its gate connected to a source of voltage.

8. A circuit for enabling and disenabling connection of a FAMOS transistor to a sense amplifier and for enabling and disenabling a P-channel programming control transistor with source/drain terminals connected between the drain of said FAMOS transistor and a programming voltage source, comprising:
    a N-channel decoder transistor having its gate connected to a source of decoder signals,
    a P-channel transistor with source/drain terminals connected to the gate of said programming control transistor and to said programming voltage source and with is gate terminal connected to receive a first signal from an enabling circuit,
    a N-channel transistor with source/drain terminals connected to said gate of said programming control transistor and to a first source/drain terminal of said N-channel decoder transistor and with its gate terminal connected to receive a second signal from said enabling circuit, a N-channel transistor with source/drain terminals connected between said terminal of said N-channel decoder transistor and said drain of said FAMOS transistor and with its gate terminal connected to receive a third signal from said enabling circuit, and a N-channel transistor with source/drain terminals connected between the second source/drain terminal of said N-channel decoder transistor and a current-limiting signal source and with its gate connected to receive said second signal from said enabling circuit.

* * * * *